(12) United States Patent  
Utsunomiya

(10) Patent No.: US 7,105,422 B2
(45) Date of Patent: Sep. 12, 2006

(54) THIN FILM CIRCUIT DEVICE, MANUFACTURING METHOD THEREOF, ELECTRO-OPTICAL APPARATUS, AND ELECTRONIC SYSTEM

(75) Inventor: Sumio Utsunomiya, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/272,696

(22) Filed: Nov. 15, 2005

(65) Prior Publication Data

US 2006/0068533 A1 Mar. 30, 2006

Related U.S. Application Data

(62) Division of application No. 10/850,405, filed on May 21, 2004.

(30) Foreign Application Priority Data

May 22, 2003 (JP) .............................. 2003-145468

(51) Int. Cl.
*H01L 21/00* (2006.01)
*H01L 21/461* (2006.01)

(52) U.S. Cl. ...................................... 438/455; 438/464

(58) Field of Classification Search ......... 438/455–464
See application file for complete search history.

(56) References Cited

U.S. PATENT DOCUMENTS

| | | | |
|---|---|---|---|
| 5,986,729 A | 11/1999 | Yamanaka et al. | |
| 6,022,766 A | 2/2000 | Chen et al. | |
| 6,426,274 B1 * | 7/2002 | Tayanaka | 438/458 |
| 6,649,980 B1 | 11/2003 | Noguchi | |
| 6,961,111 B1 | 11/2005 | Kuramasu | |
| 6,998,282 B1 * | 2/2006 | Yamazaki et al. | 438/455 |

FOREIGN PATENT DOCUMENTS

| | | |
|---|---|---|
| JP | 10-125930 | 5/1998 |
| JP | A 2000-133809 | 5/2000 |
| JP | A 2000-235348 | 8/2000 |
| JP | A 2001-51296 | 2/2001 |
| JP | A 2001-125138 | 5/2001 |
| JP | A 2001-166300 | 6/2001 |
| JP | A 2001-166301 | 6/2001 |
| JP | A 2002-217391 | 8/2002 |
| JP | A 2003-31778 | 1/2003 |
| KR | A-1998-0010576 | 4/1998 |
| KR | A-2001-0080327 | 8/2001 |

* cited by examiner

*Primary Examiner*—Cuong Nguyen
(74) *Attorney, Agent, or Firm*—Oliff & Berridge, PLC

(57) ABSTRACT

To provide a thin film circuit device in which a three-dimensional circuit structure is realized, a thin film circuit device is formed of a first thin film circuit layer and a second thin film circuit layer laminated to each other. The first thin film circuit layer contains a first thin film circuit provided between an underlayer and a protective layer and a lower connection electrode connected to the first thin film circuit and exposed at a part of the bottom surface of the underlayer. The second thin film circuit layer contains a second thin film circuit provided between an underlayer and a protective layer, an upper connection electrode connected to the second thin film circuit and exposed at a part of the top surface of the protective layer, and a lower connection electrode connected to the second thin film circuit and exposed at a part of the bottom surface of the underlayer. The first and the second thin film circuits are bonded to each other so that the lower connection electrode of the first thin film circuit layer is electrically connected to the upper electrode of the second thin film circuit layer.

9 Claims, 8 Drawing Sheets

LIGHT IRRADIATION

FIG. 8
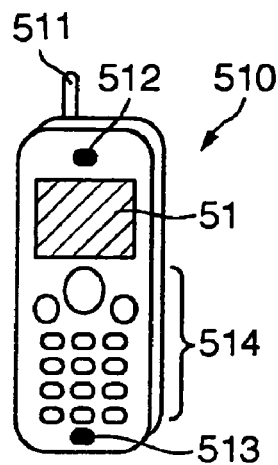
FIG.8A
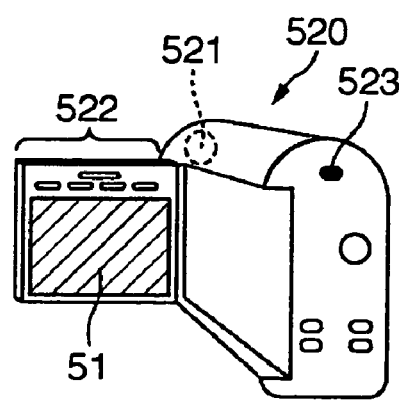
FIG.8B
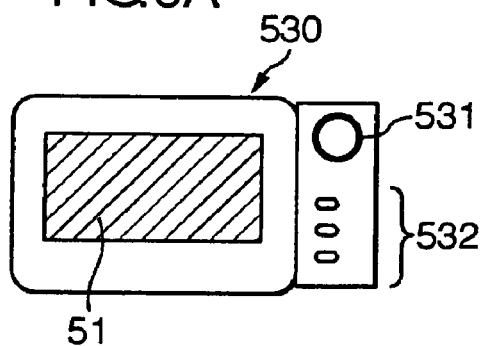
FIG.8C
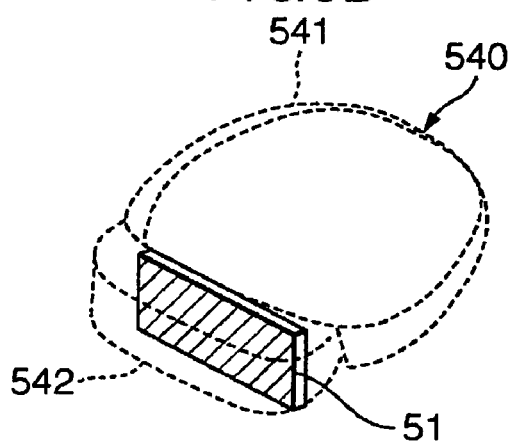
FIG.8D
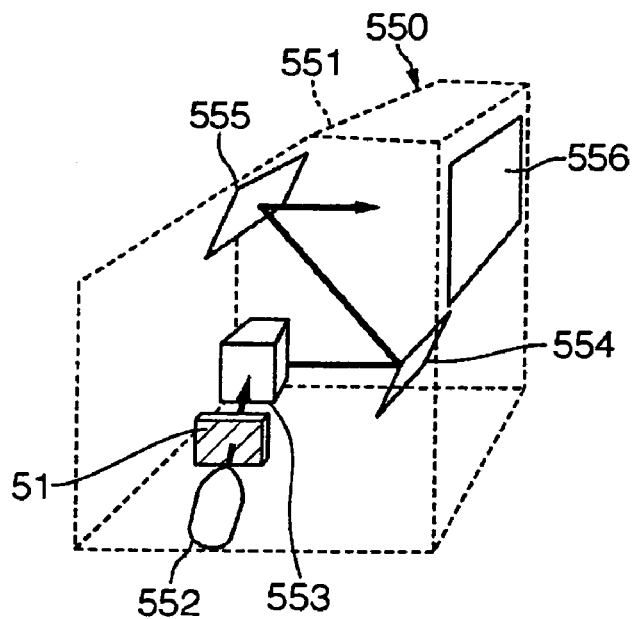
FIG.8E
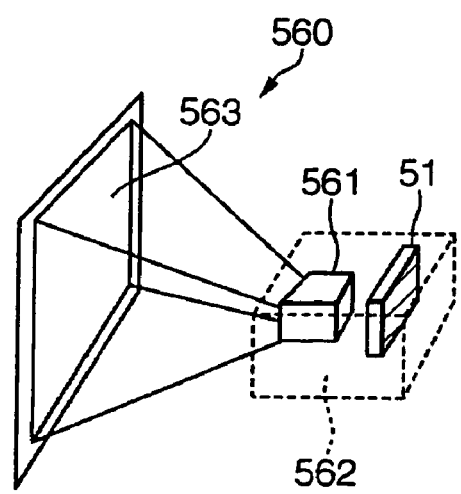
FIG.8F ововN# THIN FILM CIRCUIT DEVICE, MANUFACTURING METHOD THEREOF, ELECTRO-OPTICAL APPARATUS, AND ELECTRONIC SYSTEM This is a Division of application Ser. No. 10/850,405, filed May 21, 2004. The entire disclosure of the prior application is hereby incorporated by reference herein in its entirety.

BACKGROUND OF THE INVENTION

1. Field of Invention

The present invention relates to thin film circuit devices having a three-dimensional thin film circuit and to methods to manufacture a thin film circuit device having a three-dimensional circuit structure.

2. Description of Related Art

In semiconductor devices and the like, since high temperature processes and the like are performed when necessary layers and regions are formed on a substrate to form a laminate, selection of members to form substrates and laminates may be restricted in some cases. For example, resin films, plastic substrates, and the like are not suitable in a high temperature process.

Hence, for example, according to Japanese Unexamined Patent Application Publication No. 2002-217391, a peeling and transferring technique has been proposed in which a thin film circuit is formed above a heat resistant first substrate with an isolation layer provided therebetween. A non-heat resistant second substrate is adhered onto this thin film circuit. The isolation layer is destroyed so that the thin film circuit is transferred to the second substrate side.

SUMMARY OF THE INVENTION

Semiconductor devices and/or display devices having a three-dimensional circuit structure may be formed by laminating thin film circuits using the peeling and transferring technique described above.

However, in order to realize a three-dimensional circuit structure, wire connection between upper and lower thin film circuit layers formed by a peeling and transferring process and electrical connection between laminated films in the vertical direction must be realized. In the peeling and transferring technique performed using substrates, described above, non-electrical conductive peeling layers, adhesive layers, protective layers, and the like are used to form a laminate. However, wire connection between thin film circuits laminated to each other in the vertical direction has not been proposed.

Accordingly, the present invention provides a manufacturing method of a thin film device, which uses a peeling and transferring technique capable of laminating thin film circuit layers and of simultaneously forming electrical connection therebetween.

In addition, the present invention provides a thin film device to realize a three-dimensional circuit structure.

Furthermore, the present invention provides an electronic system using the thin film device described above.

To these ends, a thin film circuit device of an aspect of the present invention, includes: an underlayer; a thin film circuit layer formed on the underlayer and functioning as an electrical circuit; and a connection electrode which penetrates a part of the underlayer so as to be exposed approximately flush with a surface of the underlayer at the side opposite to the thin film circuit layer and which connects the thin film circuit layer to an exterior circuit.

According to the structure described above, since the connection electrode is exposed outside, the thin film circuit layer and the exterior circuit can be connected to each other. Hence thin film circuit layers can be easily laminated to each other.

The thin film circuit device described above may further include a protective layer covering at least a part of the thin film circuit layer for protection; and a connection electrode which penetrates a part of the protective layer so as to be exposed approximately flush with a surface of the protective layer at the side opposite to the thin film circuit layer and which connects the thin film circuit layer to an exterior circuit. Accordingly, the electrical connection can be performed at the upper side and the lower side of the thin film circuit layer.

In addition, a thin film circuit device according to an aspect of the present invention, includes: a heat resistant first substrate; a peeling layer which is formed on the first substrate and which is to be peeled away by energy applied thereto; an insulating underlayer formed on the peeling layer; a thin film circuit layer formed on the underlayer; a protective layer formed on the thin film circuit layer; and a connection electrode which penetrates a part of the underlayer to be in contact with the peeling layer and which is to be exposed to connect the thin film circuit layer to an exterior circuit when the peeling layer is peeled away.

According to the structure described above, a basic thin film circuit layer can be obtained to form a thin film circuit laminate device which is composed of a plurality of said thin film circuit layers. When a peeling and transferring process is repeated using the structure described above, a laminate of the thin film circuit layers can be easily formed.

The thin film circuit device described above may further include a protective layer between the peeling layer and the underlayer. By the presence of this protective layer mentioned above, damage done to the thin film circuit layer in a peeling and transferring process, in particular, damage done to the connection electrode in contact with the peeling layer can be reduced or prevented.

A thin film circuit device according to an aspect of the present invention, includes: a first thin film circuit layer having a first thin film circuit formed between an underlayer and a protective layer and a lower connection electrode connected to the first thin film circuit and exposed at a part of the bottom surface of the underlayer; and a second thin film circuit layer having a second thin film circuit formed between an underlayer and a protective layer, an upper connection electrode connected to the second thin film circuit and exposed at a part of the top surface of the protective layer, and a lower connection electrode connected to the second thin film circuit and exposed at a part of the bottom surface of the underlayer. In the thin film circuit device described above, the first thin film circuit layer and the second thin film circuit layer are laminated to each other. The lower connection electrode of the first thin film circuit layer is connected to the upper connection electrode of the second thin film circuit layer.

According to the structure described above, a basic laminate structure can be obtained which is composed of a plurality of thin film circuit layers.

In the thin film circuit device described above, the lower connection electrode and the upper connection electrode may be connected to each other with an anisotropic conductive material or a conductive adhesive. Hence, electrical connection between the thin film circuit layers can be achieved.

The lower connection electrode may be formed approximately flush with the underlayer. Hence, the bottom surface of the thin film circuit layer is planarized, and as a result, the lamination can be easily performed.

The bottom surface of the first thin film circuit layer and that of the second thin film circuit layer may be formed approximately parallel to each other. Hence, the lamination accuracy of the thin film circuit layers can be enhanced.

An electro-optical apparatus of an aspect of the present invention includes the thin film circuit device described above.

An electronic system of an aspect of the present invention includes the electro-optical apparatus described above.

A method to manufacture a thin film circuit device, according to an aspect of the present invention, includes: forming a first thin film circuit layer above a first circuit-forming substrate with a peeling layer provided therebetween, the first thin film circuit layer having one connection electrode on at least a surface thereof; forming a second thin film circuit layer above a second circuit-forming substrate with a peeling layer provided therebetween, the second thin film circuit layer having connection electrodes on one surface and another surface thereof; peeling the first thin film circuit layer from the first circuit-forming substrate so that the first thin film circuit layer is transferred to a transfer substrate; bonding the second thin film circuit layer to the first thin film circuit layer transferred to the transfer substrate so that one of said connection electrodes of the second thin film circuit layer overlaps the connection electrode of the first thin film circuit layer; and peeling the second thin film circuit layer from the second circuit-forming substrate so that the second thin film circuit layer is transferred to the first thin film circuit layer to form a laminate.

According to the manufacturing method described above, a thin film circuit device formed of thin film circuit layers laminated to each other can be manufactured.

In the method to manufacture a thin film circuit device, described above, at least one of the first thin film circuit layer and the second thin film circuit layer may be formed by a process including forming an underlayer on the peeling layer provided on the circuit-forming substrate; forming a thin film circuit on the underlayer; forming a contact hole penetrating a part of the underlayer to expose the peeling layer; forming an electrode wire between the contact hole and the thin film circuit; and forming a protective layer on the thin film circuit and the electrode wire. Hence, a thin film circuit layer provided with a connection electrode can be obtained as a transfer unit.

The method to manufacture a thin film circuit device, described above, may include: forming a protective layer between the peeling layer and the thin film circuit layer; and removing the protective layer after the thin film circuit layer is peeled away to transfer. Accordingly, the damage done to the thin film circuit layer in a peeling and transferring process, in particular, the damage done to the connection electrode in contact with the peeling layer can be reduced or prevented.

The protective layer may be formed of a material different from that for the underlayer of the thin film circuit layer, and for example, a film made of silicon nitride or a metal may be used.

The protective layer described above may be formed to have a three-layered structure composed, for example, of an amorphous silicon layer/an insulating film (silicon oxide or silicon nitride)/an amorphous silicon layer. In the case described above, the amorphous silicon layer at the lower side (at the circuit-forming substrate side) functions as a peeling layer, and the amorphous silicon layer at the upper side functions as a protective layer.

BRIEF DESCRIPTION OF THE DRAWINGS

FIGS. 8A to 8F are schematics for illustrating electronic systems using a thin film circuit device of an aspect of the present invention, the device formed by laminating thin film circuit layers to each other.

DETAILED DESCRIPTION OF EXEMPLARY EMBODIMENTS

Hereinafter, the exemplary embodiments of the present invention will be described with reference to drawings.

A thin film circuit device of an exemplary embodiment of the present invention has a structure in which thin film circuits are laminated to each other in the vertical direction, and in which, among the circuits mentioned above, an intermediate thin film circuit present inside the laminate is formed to have electrodes on the upper and the lower surfaces thereof for electrical connection. In addition, in the thin film circuit device according to the exemplary embodiment of the present invention, since an electrode is formed which is exposed at the rear surface of the thin film circuit, connection with a thin film circuit located thereunder and/or an exterior wire can be easily achieved.

In a manufacturing method according to an exemplary embodiment of the present invention, a process to manufacture a thin film circuit device using a peeling and transferring technique includes forming a contact hole penetrating an underlayer of a thin film circuit layer, and forming a conductive film in the contact hole using a metal or the like so as be exposed at the bottom surface of the underlayer. This conductive film is used as a rear surface electrode to connect with another thin film circuit layer. This rear surface electrode and the underlayer of the thin film circuit layer are formed flush with each other so that the rear surface of the thin film circuit layer is flat. Hence the lamination of the layers can be easily performed. Irregularities generated on a surface of a thin film circuit layer located at the upper side can be reduced or prevented, which irregularities are formed when thin film circuit layers having irregular surfaces are laminated to each other.

Figure 1:
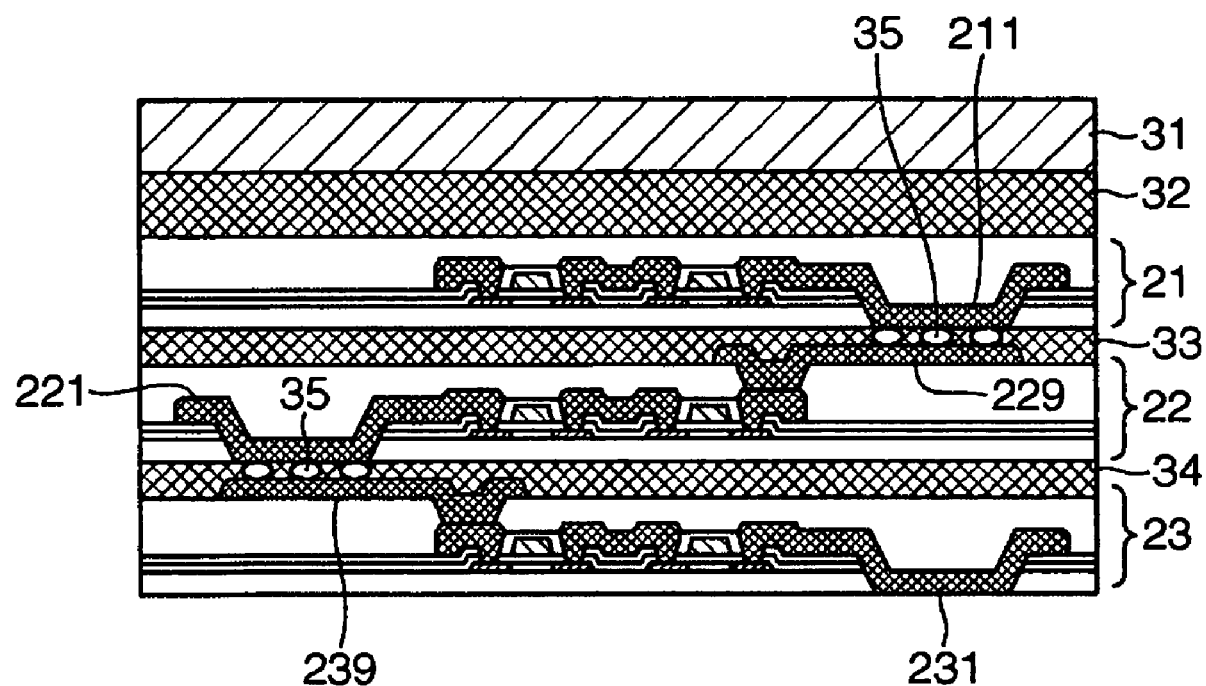
FIG. 1 is a schematic for illustrating a thin film circuit device of an aspect of the present invention, which is formed of thin film circuit layers laminated to each other.

FIG. 1 is a cross-sectional schematic showing an example of a thin film circuit device according to an aspect of the present invention, the device having a three-dimensional circuit composed of thin film circuit layers laminated to each other.

In this figure, a first thin film circuit layer 21 is mounted on a transfer substrate 31 with an adhesive 32 provided therebetween. A second thin film circuit layer 22 is mounted on this first thin film circuit layer 21 with an adhesive 33 provided therebetween. Furthermore, a third thin film circuit layer 23 is mounted on this second thin film circuit layer 22 with an adhesive 34 provided therebetween. Each thin film circuit layer has a thin film circuit including at least one of a thin film transistor, a diode, a resistor, a capacitor, a wire, and an electrode and has a predetermined circuit function.

Connection between the thin film circuit layers 21 and 22 is performed with a lower electrode 211 of the thin film circuit layer 21, an upper electrode 229 of the thin film circuit layer 22, and an anisotropic conductive material 35 provided between the electrodes 211 and 229. Connection between the thin film circuit layers 22 and 23 is performed with a lower electrode 221 of the thin film circuit layer 22, an upper electrode 239 of the thin film circuit layer 23, and an anisotropic conductive material 35 provided between the electrodes 221 and 239. The anisotropic conductive material 35 has conductive properties in a compressive direction. For example, when conductive particles are dispersed in an insulating elastic material, and the elastic material is then compressed, the conductive particles are connected to each other, thereby forming an electrical conductive path in the compressive direction.

The lowermost thin film circuit layer 23 has a lower electrode 231 exposed at the bottom surface thereof. An exterior wire, not shown in the figure, is connected to this lower electrode 231 with a flexible printed wire, tab bonding, wire bonding, or the like. The bottom surfaces of underlayers (212, 222, and 232 described later) carrying the thin film circuits of the individual thin film circuit layers and the exposed surfaces of the lower electrodes exposed at the underlayers are formed to be flush with each other. Accordingly, when the adhesive layers 32, 33, and 34 adhering between the thin film circuit layers are applied or formed so as to have flat top surfaces, thin film circuit layers (underlying substrates) can be laminated so that the individual bottom surfaces are approximately parallel to each other, and as a result, a three-dimensional circuit structure can be precisely formed.

Alternatively, instead of the anisotropic conductive material 35 described above or in addition thereto, a conductive adhesive may be used for connection between the electrodes.

In the exemplary embodiment described above, the thin film circuit layer 21 located at the upper side and the thin film circuit layer 23 located at the lower side are connected to each other with a thin film transistor circuit of the thin film circuit layer 22. However, the thin film circuit layers 21 and 23 may be connected to each other only by an electrode wire. For example, in the case of an electrical power supply wire, the direct connection mentioned above may be applied.

As described above, when thin film circuit layers having electrodes exposed at the upper and the lower surfaces thereof are laminate to each other, a thin film device having a three-dimensional electrical circuit can be obtained.

Next, with reference to FIGS. 2 to 4, a method to manufacture a thin film device having the above three-dimensional circuit structure will be described.

Figure 2A:
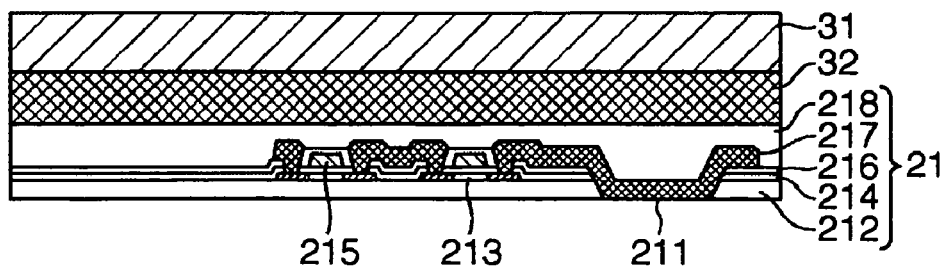
FIGS. 2A to 2D show a process for manufacturing a thin film circuit layer.

In order to laminate thin film circuit layers, as shown in FIG. 2A, the lower electrode layer 211 exposed at the underlayer 212 of the thin film circuit layer 21 must be formed.

FIGS. 3 and 4 show a process for illustrating forming the thin film circuit layer 21.

Figure 3A:
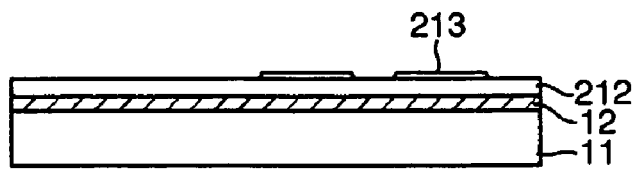
FIGS. 3A to 3H show a process for illustrating manufacturing steps of a thin film circuit layer.

First, on a transparent circuit-forming substrate 11, having superior heat resistance and made of quartz glass substrate (SiO$_2$) or the like, a film of amorphous silicon (α-Si) is formed as a peeling layer 12 by LP-CVD, sputtering, PE-CVD, or the like. On the film thus formed, as the underlayer (insulating layer) 212 of the thin film circuit 21, a silicon oxide (SiO$_2$) film is formed by PE-CVD. On the film thus formed, a silicon (Si) layer 213 is formed as a semiconductor layer by CVD and is then (poly)crystallized by heat treatment, such as laser radiation. This silicon layer 213 is patterned to form an active region of a transistor, a wire, and the like (FIG. 3A).

Figure 3B:
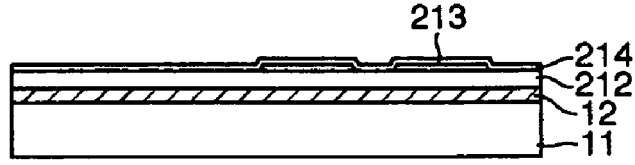

On the layer thus patterned, a silicon oxide film is formed by thermal oxidation or PE-CVD using TEOS or the like, thereby forming a gate insulating film 214 (FIG. 3B).

Figure 3C:
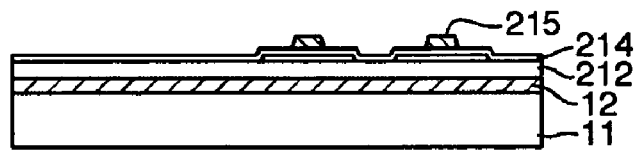

On the gate insulating film 214, a polysilicon layer doped with an impurity is formed by a CVD method or the like, or a metal thin film layer primarily composed of chromium, molybdenum, tantalum, aluminum, or the like is formed by sputtering, followed by patterning, thereby forming a gate electrode and a wire 215 (FIG. 3C).

Figure 3D:
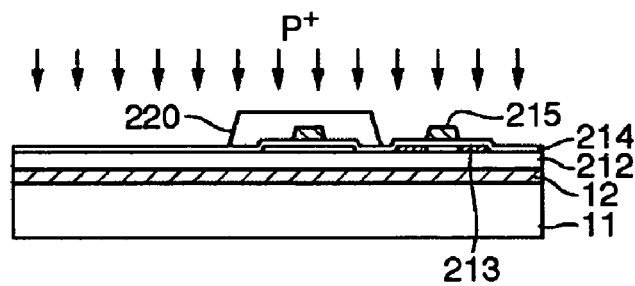
Figure 3E:
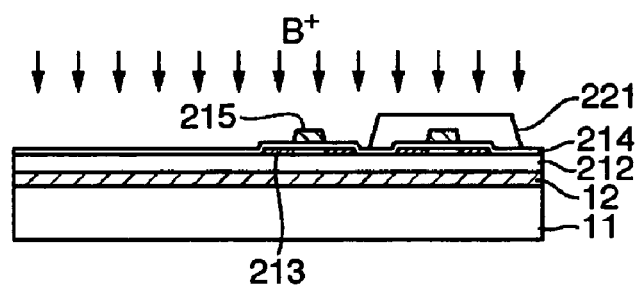

Next, using a resist 220 and the gate electrode 215 as a mask, for example, phosphorous ions P$^+$ at a high concentration, are implanted into the silicon layer 213 by ion implantation, thereby forming source and drain regions made of an N-type semiconductor (FIG. 3D). In the same manner as described above, using a resist 221 and the gate electrode 215 as a mask, boron ions at a high concentration are implanted into the silicon layer 213 by ion implantation, thereby forming source and drain regions made of a P-type semiconductor. In addition, heat treatment is performed, thereby activating impurities in the source and drain regions and the wires (FIG. 3E).

Figure 3F:
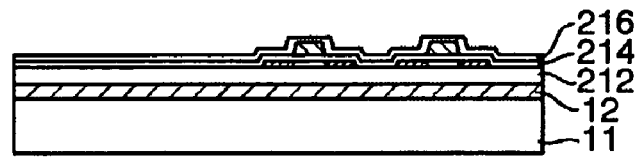

On the gate electrodes 215 and the gate oxide film 214, a silicon oxide film is formed by a CVD method as an interlayer insulating film 216 (FIG. 3F).

Figure 3G:
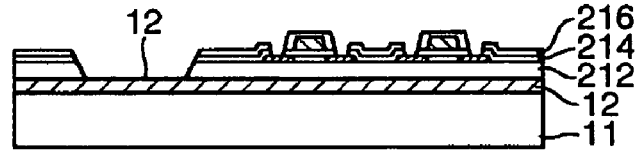

Next, the interlayer insulating film 216 is patterned, thereby forming contact holes. In addition to contact holes in the source and the drain regions of the transistors, a part of the underlayer 212 at which the lower electrode 211 is to be formed is also etched (FIG. 3G). In order to form the lower electrode 211, said part described above is etched until the peeling layer 12 is exposed.

Figure 3H:
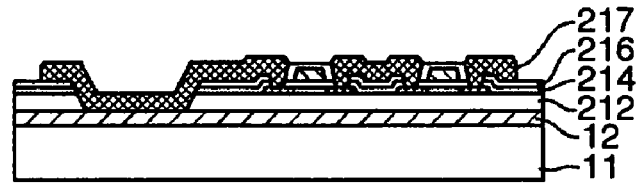

Subsequently, a film, which is composed, for example, of a metal, such as aluminum, molybdenum, tungsten, or ITO, or polysilicon heavily doped with an impurity, is formed and is then patterned, thereby forming the lower electrode, wire, and source and drain electrodes 217 (FIG. 3H).

Figure 4A:
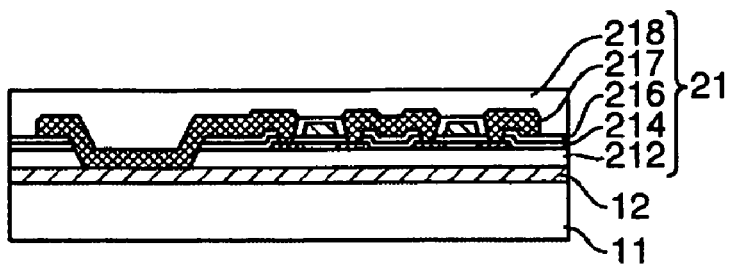
FIGS. 4A to 4E show a process for illustrating manufacturing a thin film circuit layer having a connection electrode for connection between thin film circuit layers.

Furthermore, as shown in FIG. 4, an interlayer insulating film (SiO$_2$) or a protective film (PSG) 218 is formed on the laminate thus formed, followed by polishing whenever necessary for planarization (FIG. 4A). In this case, as the protective film 218, a film may be formed by applying an insulating resin using spin coating onto the upper surface of the circuit-forming substrate 11 provided with wires or the like, so as to form a flat surface. As described above, the thin film circuit layer 21 is formed.

Figure 4B:
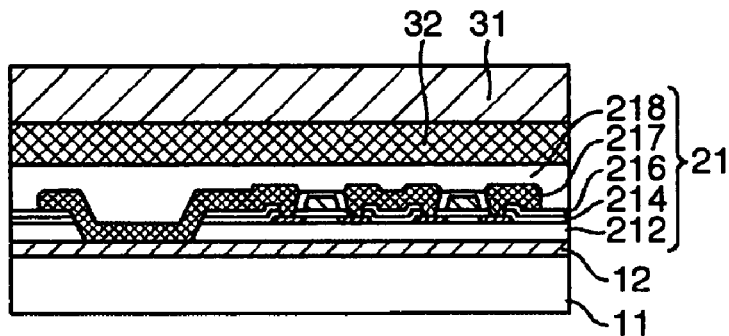

Furthermore, the adhesive 32 is uniformly applied onto the upper surface of the thin film circuit layer 21 and is mounted on the transfer substrate 31 (FIG. 4B).

The peeling layer 12 is irradiated with intensive light, such as laser light, from below the circuit-forming substrate 11, thereby causing interfacial peeling or interlayer peeling of the peeling layer 12. For example, as disclosed in Japanese Unexamined Patent Application Publication No.

Figure 4C:
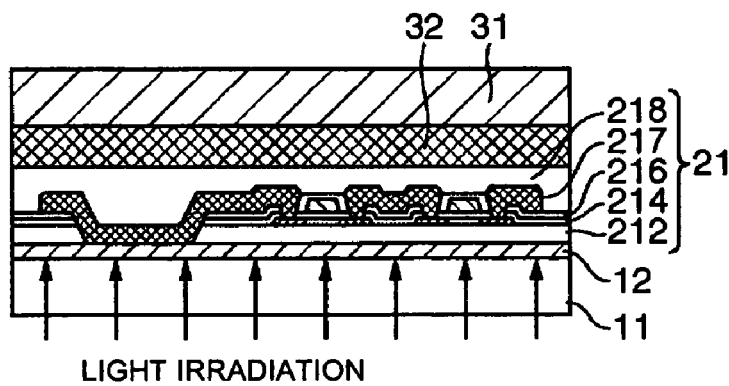

10-125930, the reasons for the generation of interfacial and/or interlayer peeling of the peeling layer 12 are believed to be as follows. The ablation of materials of the peeling layer 12, the emission of gas components contained in the peeling layer 12, and/or the phase transformation, such as fusion or evaporation of the peeling layer 12 by irradiation with light, may occur. In this case, the ablation means the phenomenon in that a solid material (in this case, materials forming the peeling layer 12) absorbing irradiating light is thermally or opto-chemically excited. As a result, atoms present on the surface or inside or molecular fragments formed by chemical bond dissociation are emitted. In this case, the peeling layer 12 is destroyed, the bonding force thereof is decreased, and as a result, the peeling layer 12 may disappear in some cases (FIG. 4C).

Figure 4D:
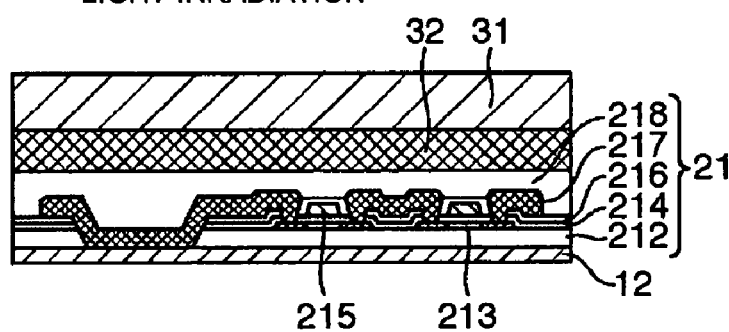
Figure 4E:
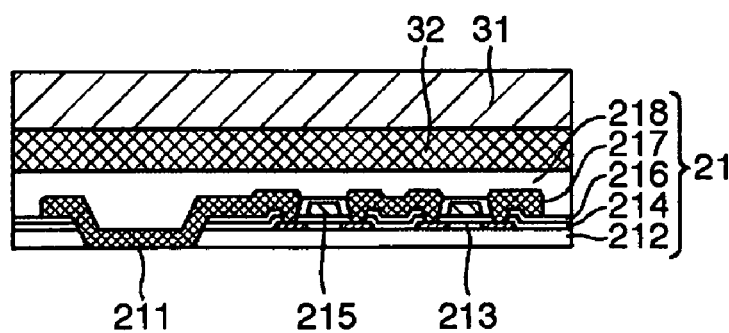

The thin film circuit layer 21 is peeled away from the circuit-forming substrate 11 and is transferred to the transfer substrate 31 (FIG. 4D). In addition, the remaining peeling layer 12 is removed by etching, thereby forming a substrate having the first thin film circuit layer 21 shown in FIG. 2A (FIG. 4E).

Figure 2B:
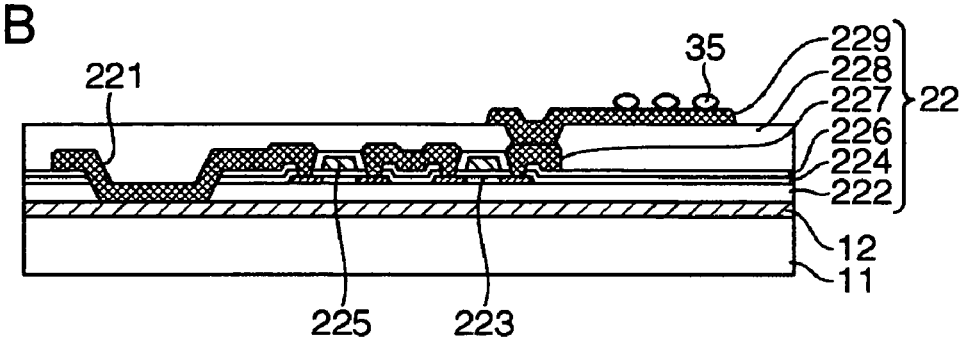

FIG. 2B shows the second thin film circuit layer 22 formed above the circuit-forming substrate 11 before a peeling and transferring process is performed. The thin film circuit layer 22 includes the underlayer 222, a semiconductor layer 223, a gate insulating layer 224, a gate electrode and a wiring layer 225, an interlayer insulating film 226, source and drain electrodes 227, a protective film 228, and an upper electrode 229. The second thin film circuit layer 22 is also formed above the circuit-forming substrate 11 with the peeling layer 12 provided therebetween as is the first thin film circuit layer 21 (see FIGS. 3 and 4). However, the second thin film circuit layer 22 provided at an intermediate position of the thin film circuit layers thus laminated is formed to have the upper electrode 229 exposed at the protective film 228 in addition to the lower electrode 221.

The upper electrode 229 may be formed as shown in FIG. 4A in which a contact hole is formed in the protective film 218 (corresponding to 228), and a film is then formed using a wire material, followed by patterning.

Figure 2C:
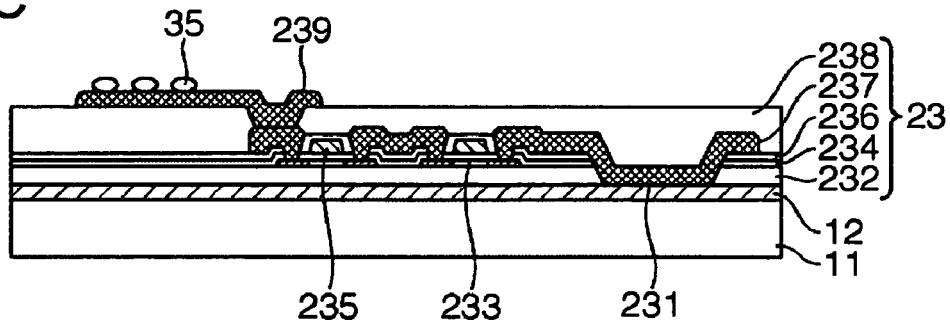

FIG. 2C shows the third thin film circuit layer 23 formed above the circuit-forming substrate 11 before a peeling and transferring process is performed. The thin film circuit layer 23 includes the underlayer 232, a semiconductor layer 233, a gate insulating layer 234, a gate electrode and a wiring layer 235, an interlayer insulating film 236, source and drain electrodes 237, a protective film 238, and an upper electrode 239. The third thin film circuit layer is also formed above the circuit-forming substrate 11 with the peeling layer 12 provided therebetween as is the first thin film circuit layer 21. However, the third thin film circuit layer provided at the bottommost position of the thin film circuit laminate is formed to have the upper electrode 239 exposed at the protective film 238 in addition to the lower electrode 231. The upper electrode 239 may be formed as shown in FIG. 4A in which a contact hole is formed in the protective film 218 (corresponding to 238), and a film is then formed using a wire material, followed by patterning.

Figure 2D:
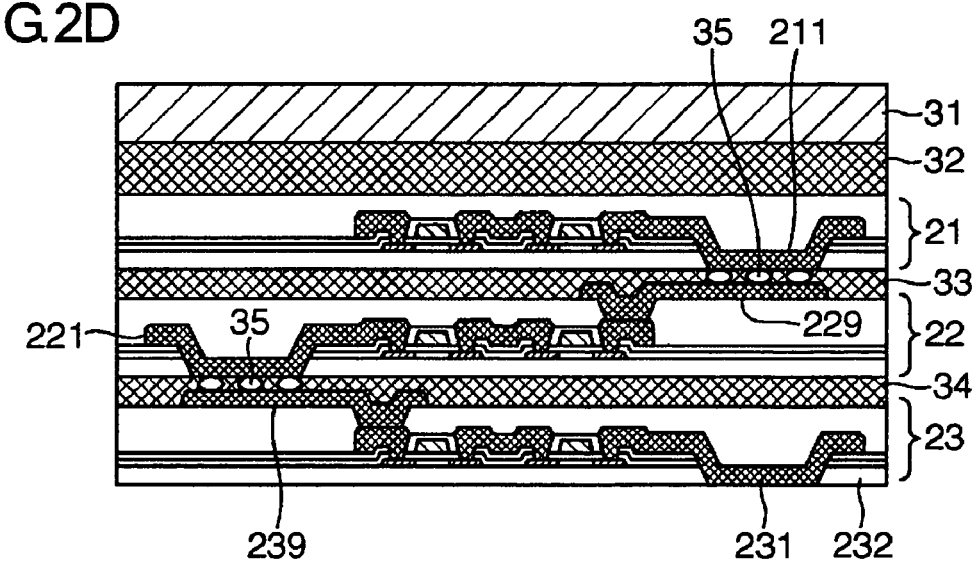

As shown in FIG. 2D, the thin film circuit layers 21 to 23 each formed on the circuit-forming substrate are laminated to each other by a peeling and transferring method.

The thin film circuit layer 22 shown in FIG. 2B is bonded with the anisotropic conductive layer 35 and the adhesive 33 to the bottom surface of the thin film circuit layer 21 mounted on the transfer substrate 31 shown in FIG. 2A. The thin film circuit layer 22 is irradiated with laser light from the side of the bottom surface of the circuit-forming substrate 11 so that the peeling layer 12 is peeled away, thereby separating the circuit-forming substrate 11 from the thin film circuit layer 22. Whenever necessary, the remaining peeling layer 12 is removed by etching.

The thin film circuit layer 23 shown in FIG. 2C is bonded with the anisotropic conductive layer 35 and the adhesive 34 to the bottom surface of the thin film circuit layer 22 mounted at the transfer substrate 31 side. The thin film circuit layer 23 is irradiated with laser light from the side of the bottom surface of the circuit-forming substrate 11 so that the peeling layer 12 is peeled away, thereby separating the circuit-forming substrate 11 from the thin film circuit layer 23. Whenever necessary, the remaining peeling layer 12 is removed by etching.

As described above, a thin film device composed of three-dimensionally arranged thin film circuits is formed as shown in FIG. 1. The connection of the thin film device to exterior wires can be performed with the lower electrode 231 exposed at the bottom surface using a solder bump, a flexible wire substrate (tape), wire bonding, and the like.

Amorphous silicon has been described as a material for the peeling layer 12 by way of example, and this amorphous silicon may contain H (hydrogen). When hydrogen is contained, since an internal pressure is generated in the peeling layer due to emission of hydrogen by irradiation with light, the peeling thereof is facilitated. The content of hydrogen is adjusted in consideration of film-forming conditions. For example, in the case in which a CVD method is used, a gas composition, a gas pressure, a gas atmosphere, a gas flow, a gas temperature, a substrate temperature, input power of light, and the like are taken into consideration. In addition, as the peeling layer, silicon oxide or a siliconate compound, titanium oxide or a titanate compound, an organic high molecular material, a metal, or the like may be optionally used.

When thin film circuit layers are laminated to each other in a three-dimensional manner as described above by a peeling and transferring method, an electrode for electrical connection may be formed at the bottom surface of the thin film circuit layer. FIGS. 5 and 6 each show an example of another thin film circuit layer having an electrode at the bottom surface of a thin film circuit layer.

In the example shown in FIGS. 5A to 5F, an underlying protective layer 13 is formed between the peeling layer 12 and the underlayer 212 and the lower electrode 211. In the figure, the same reference numerals as those in FIG. 4 designate corresponding elements, and descriptions thereof are omitted.

Figure 5A:
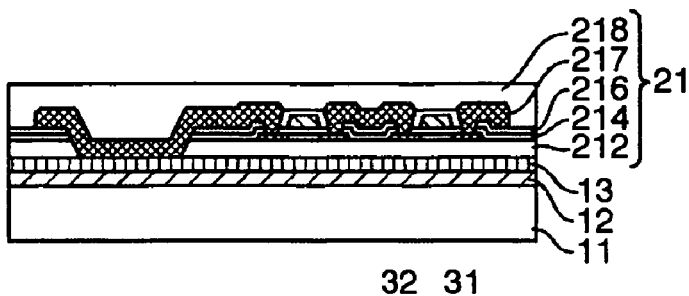
FIGS. 5A to 5F show another process for illustrating manufacturing of a thin film circuit layer having a connection electrode for connection between thin film circuit layers.
Figure 5B:
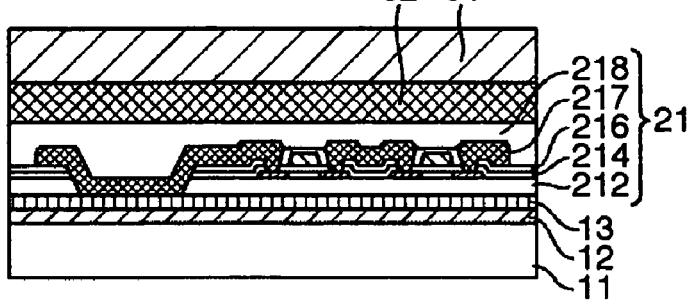
Figure 5C:
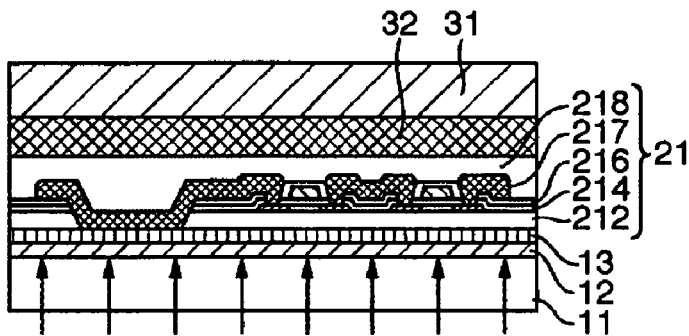
Figure 5D:
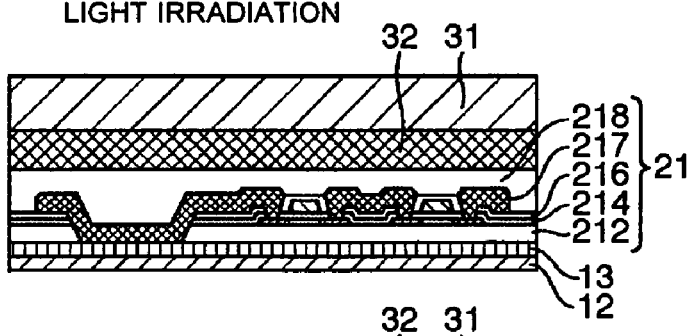
Figure 5E:
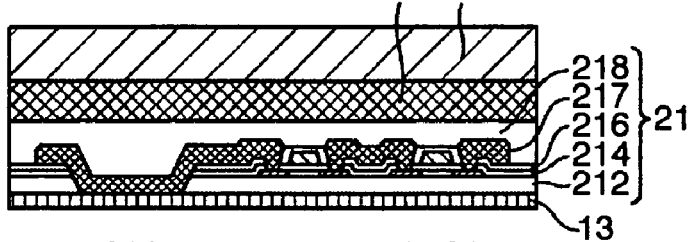
Figure 5F:
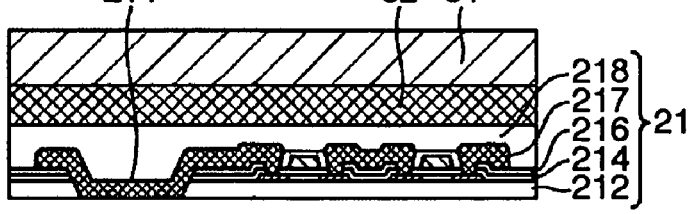

The underlying protective layer 13 is composed of a silicon nitride (SiN) layer or a metal layer, which is formed of a material different from that for the underlayer 212, and which has functions of reducing the likelihood or preventing unnecessary components from intruding into the lower electrode 211 and the underlayer 212 from the peeling layer 12 and of reducing the likelihood or preventing the lower electrode 211 and the underlayer 212 from being damaged by heat and destructive energy applied to the peeling layer 12 when a peeling and transferring process is performed. The underlying protective layer 13 is removed by etching as shown in FIGS. 5E and 5F after the thin film circuit layer 21 is peeled and transferred.

As described above, the underlying protective layer 13 may be etched by a method having a large selectivity between the underlying protective layer 13 and the underlayer 212 and/or the lower electrode 211. For example, when silicon nitride is used for the underlying protective layer 13, phosphoric acid, nitric acid, acetic acid, or a mixed solution (mixed acid) thereof is used to etch the underlying protective layer 13. Since the etching rate of the underlayer 212 composed, for example, of a silicon oxide is low, the underlying protective layer 13 can be fully removed by over-etching. In addition, by forming a conductive protective layer of chromium, titanium, ITO, or the like on the bottom surface of the lower electrode 211, corrosion thereof caused by the etching of the underlying protective layer 13 may be reduced or prevented.

In the example shown in FIGS. 6A to 6F, protective layers 13 and 14 are formed between the peeling layer 12 and the underlayer 212 and the lower electrode 211. In the figure, the same reference numerals as those in FIG. 4 designate corresponding elements, and descriptions thereof are omitted.

Figure 6A:
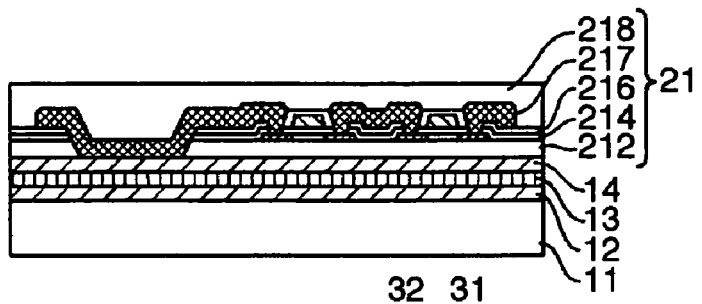
FIGS. 6A to 6F show still another process for illustrating manufacturing of a thin film circuit layer having a connection electrode for connection between thin film circuit layers.
Figure 6B:
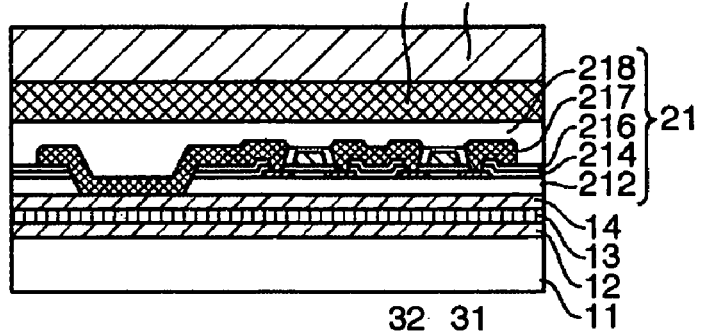
Figure 6C:
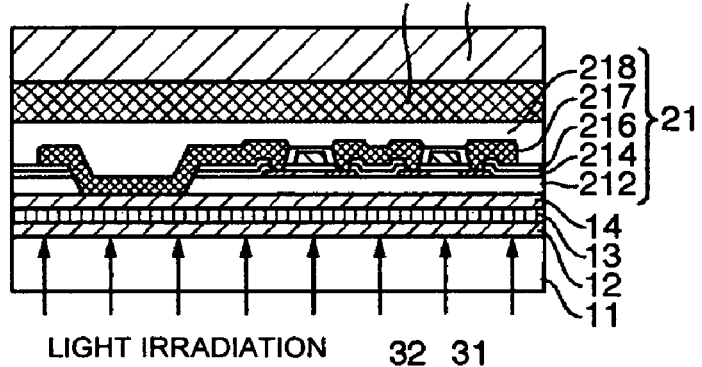
Figure 6D:
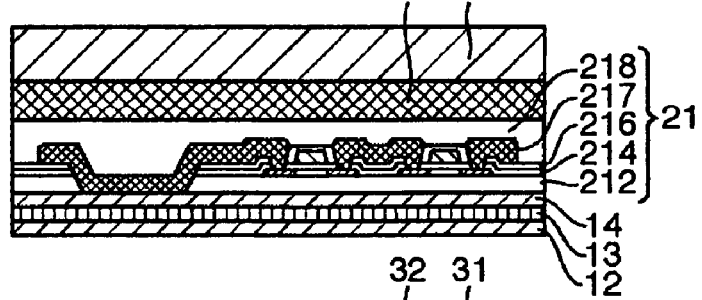
Figure 6E:
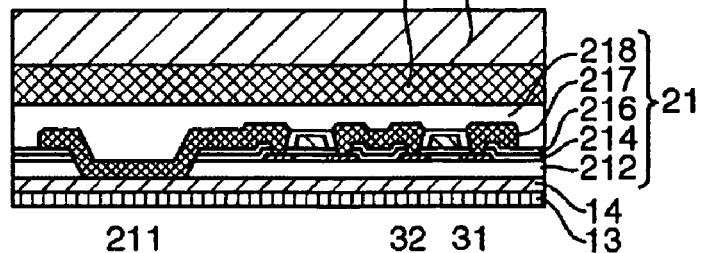
Figure 6F:
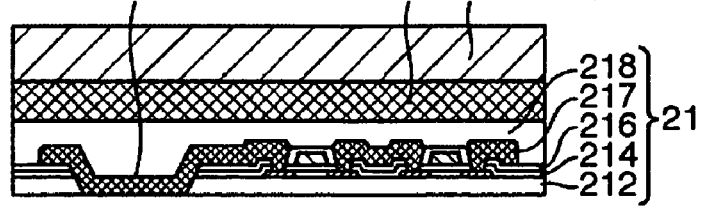

The protective layer 13 is an insulating film formed, for example, of a silicon oxide layer or a silicon nitride layer, and the protective layer 14 is, for example, an amorphous silicon layer. Of the two amorphous silicon layers 12 and 14 thus formed, the lower side layer and the upper side layer function as a peeling layer and a protective layer, respectively. The underlying protective layers 13 and 14 are removed by etching, as shown in FIGS. 6E and 6F, after the thin film circuit layer 21 is peeled and transferred.

As is the case described above, the underlying protective layer 13 may be etched by a method having a large selectivity between the underlying protective layers 13 and 14 or between the underlying protective layer 14 and the underlayer 212 and/or the lower electrode 211. For example, when silicon oxide is used for the underlying protective layer 13, and an amorphous silicon layer is used as the underlying protective layer 14, a solution containing fluoric acid may be used to etch the underlying protective layer 13. Since the etching rate of the underlying protective layer 14 is low, the underlying protective layer 13 can be fully removed by over-etching. In addition, when the underlying protective layer 14 is etched, for example, dry etching may be performed using a gas containing $CF_4$. Since the etching rate of the underlayer 212 formed, for example, of silicon oxide is low, the underlying protective layer 14 can be fully removed by over-etching. In addition, by forming a conductive protective layer of chromium, titanium, ITO, or the like on the bottom surface of the lower electrode 211, corrosion thereof caused by the etching of the underlying protective layer 14 may be reduced or prevented.

Figure 7:
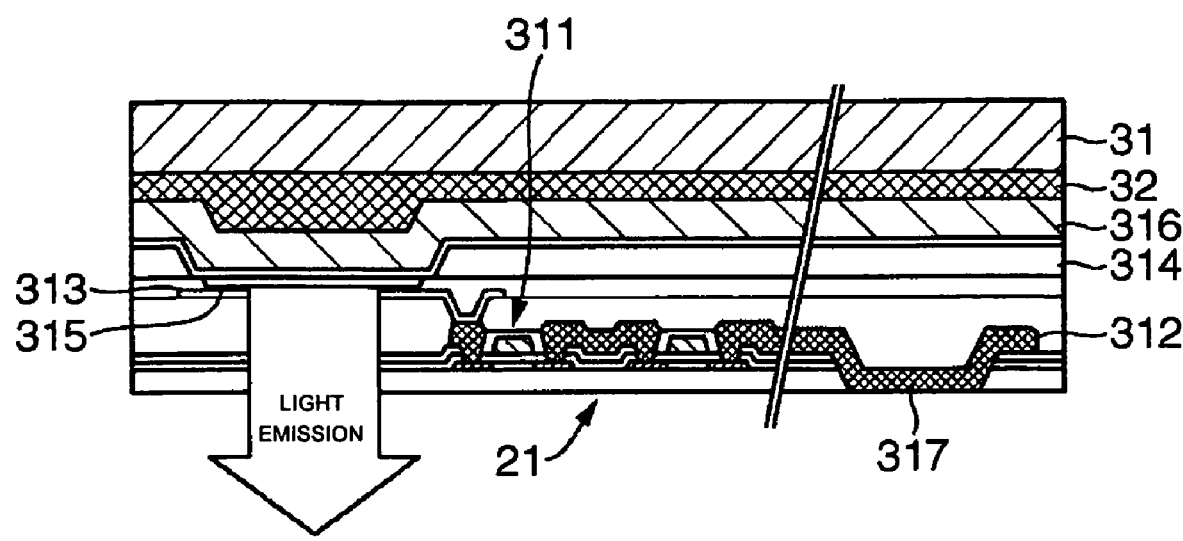
FIG. 7 is a schematic for illustrating a particular example (organic EL display apparatus) of a thin film circuit device.

FIG. 7 shows a particular example of a thin film circuit layer, in which an inverted type organic EL display element is formed on a first thin film circuit layer. On a peeling layer provided on a circuit-forming substrate not shown in the figure, a thin film transistor 311, a wire 312, an anode 313, a bank 314, a light-emitting layer 315, a cathode 316, and the like are provided to form a thin film circuit layer. This thin film circuit layer is peeled and transferred onto the transfer substrate 31. Since the thin film circuit layer 21 is transferred onto the transfer substrate 31, a lower electrode 317 is exposed at an underlayer located at the bottom surface.

Since the exterior connection electrode 317 is formed to be exposed at the bottom surface of the thin film circuit layer 21 as shown in FIG. 7, signals can be supplied from the outside. By a peeling and transferring process performed only once on the transfer substrate 31, the thin film circuit layer 21 having an inverted structure with respect to the transfer substrate 31 can be used as a thin film circuit of an organic EL pixel. In the case described above, compared to the case in which a non-inverted structure is formed by performing a peeling and transferring process twice with the use of a temporary transferring substrate, the number of steps can be advantageously decreased.

Accordingly, the lamination of thin film circuit layers may be performed by changing the number of layers in consideration of the lamination position and the complicacy of circuit. For example, a second thin film circuit layer may be provided on a part of a first thin film circuit layer. On a part of this second thin film circuit layer, a third thin film circuit layer may be further provided. In addition, a plurality of second thin film circuit layers is provided on a first thin film circuit layer. On said plurality of second thin film circuit layers, a third thin film circuit layer may be formed.

As described above, the structure of lamination of thin film circuit layers may be variously formed, and an optional structure may be selected in accordance with requirements.

FIGS. 8A–8E include schematics for illustrating examples of electronic systems using electro-optical apparatuses provided with various thin film circuit devices according to the present invention. The thin film circuit devices described above are used, for example, for electro-optical apparatus, drive apparatus, and control apparatus. In an aspect of the present invention, the electro-optical apparatus generally indicate apparatus each provided with an electro-optical element having an electrical function of emitting light or changing the state of light incident from the outside, and the electro-optical apparatus include an apparatus that emits light by itself and an apparatus that controls exterior light passing therethrough. For example, as the electro-optical elements, there may be mentioned liquid crystal elements, electrophoretic elements composed of a dispersion medium and electrophoretic particles dispersed therein, the EL (electroluminescent) elements described above, and electron-emitting elements emitting light by colliding electrons against a light-emitting plate, the electrons being generated by application of an electric field, and display apparatuses provided with the elements mentioned above are called electro-optical apparatus.

As the electronic system, for example, there may be mentioned an electronic system which uses an electro-optical apparatus provided with a thin film circuit laminate device as a display portion, and in an aspect of the present invention, video cameras, televisions, large screen display systems, mobile phones, personal computers, portable information systems (so-called PDA), and the like may be mentioned as the electronic systems.

FIG. 8A shows a mobile phone as one example of the electronic system. A mobile phone 510 is composed of an antenna part 511, a voice output part 512, a voice input part 513, an operation part 514, and an electro-optical apparatus 51 including a thin film circuit laminate device. As described above, the thin film circuit laminate device of an aspect of the present invention can be used as a display portion of the mobile phone 510. FIG. 8B shows a video camera as one example of the electronic system, and a video camera 520 is composed of an image-receiving part 521, an operation part 522, a voice input part 523, and the electro-optical apparatus 51 including a thin film circuit laminate device. As described above, the thin film circuit laminate device of an aspect of the present invention can be used as a viewfinder and/or a display portion. FIG. 8C shows a portable personal computer as one example of the electronic system, and a portable personal computer 530 is composed of a camera part 531, an operation part 532, and the electro-optical apparatus 51 including a thin film circuit laminate device. As described above, the thin film circuit laminate device of an aspect of the present invention can be used as a display portion.

FIG. 8D shows a headmount display as one example of the electronic system. A headmount display 540 is composed of a band 541, an optical system container 542, and the electro-optical apparatus 51 including a thin film circuit laminate device. As described above, the thin film circuit laminate device of an aspect of the present invention can be used as an image display apparatus. FIG. 8E shows a rear projector as one example of the electronic system, and a projector 550 is composed of a light source 552, a synthetic optical system 553, a mirror 554, a mirror 555, a screen 556, and the electro-optical apparatus 51 including a thin film circuit laminate device, which are contained in a case 551. As described above, the thin film circuit laminate device of an aspect of the present invention can be used as an image display apparatus. FIG. 8F shows a front projector as one example of the electronic system. A projector 560 has a case 562 in which an optical system 561 and the electro-optical apparatus 51 including a thin film circuit laminate device are contained, and in the front projector, an image can be displayed on a screen 563. As described above, the electro-optical apparatus of an aspect of the present invention can be used as an image display apparatus.

In addition to the examples described above, the thin film circuit laminate device of an aspect of the present invention can be applied to various electronic systems. For example, the thin film circuit laminate device of an aspect of the present invention may be used for facsimile machines provided with a display function, viewfinders of digital cameras, portable televisions, DSP systems, PDA, electronic notebooks, electric bulletin boards, advertisement display systems, and the like.

As has thus been described, according to an aspect of the present invention, a thin film circuit device can be formed by laminating thin film circuit layers to each other using a peeling and transferring method. In addition, by using a laminated thin film circuit layers, an area of the substrate in which circuits are formed can be decreased as compared to that in the case in which individual circuits are directly formed on the substrate. Furthermore, by laminating thin film circuits to each other, the distance of signal transmittance between the circuits can be decreased.

What is claimed is:

1. A method of manufacturing a thin film circuit device, comprising:
    forming a first peeling layer over a first substrate;
    forming a first underlayer over the first peeling layer;
    forming a first thin film circuit over the first underlayer;
    forming a first contact hole at the first underlayer by exposing at least the surface of the first peeling layer;
    forming a first wire and a first connection electrode that is formed at a bottom of the first contact hole, the first wire connected between the first thin film circuit and the first connection electrode;
    forming a first protective layer over the first underlayer so as to be covered with the first thin film circuit, the first connection electrode and the first wire;
    forming a second peeling layer over a second substrate;
    forming a second underlayer over the second peeling layer;
    forming a second thin film circuit over the second underlayer;
    forming a second protective layer over the second underlayer so as to be covered with the second thin film circuit;
    forming a second contact hole at the second protective layer;
    forming a second wire and a second connection electrode that is formed over the second protective layer, the second wire connected between the second thin film circuit and the second connection electrode;
    transferring the first thin film circuit from the first substrate to a third substrate, the transferring the first thin film circuit including the first thin film circuit being peeled by using the first peeling layer and the first connection electrode exposes against the third substrate; and
    peeling the second thin film circuit from the second substrate so that the second connection electrode bonds the first connection electrode.

2. The method of manufacturing a thin film circuit device according to claim 1, further comprising:
    forming a third protective layer over the first peeling layer after the forming the first peeling layer.

3. The method of manufacturing a thin film circuit device according to claim 2, further comprising:
    removing the third protective layer after the transferring the first thin film circuit.

4. The method of manufacturing a thin film circuit device according to claim 1, further comprising:
    forming a fourth protective layer over the second peeling layer after the forming the second peeling layer.

5. The method of manufacturing a thin film circuit device according to claim 4, further comprising:
    removing the fourth protective layer after the peeling the second thin film circuit.

6. The method of manufacturing a thin film circuit device according to claim 1, further comprising:
    forming a third contact hole at the first protective layer; and
    forming a third wire and a third connection electrode that is formed over the first protective layer, the third wire connected between the first thin film circuit and the third connection electrode.

7. The method of manufacturing a thin film circuit device according to claim 1, further comprising:
    forming a fourth contact hole at the second underlayer by exposing at least the surface of the second peeling layer; and
    forming a fourth wire and a fourth connection electrode that is formed at a bottom of the fourth contact hole, the fourth wire connected between the second thin film circuit and the fourth connection electrode.

8. The method of manufacturing a thin film circuit device according to claim 1, the first peeling layer forming a material which has a function of peeling by irradiating energy, and
    the transferring the first thin film circuit including irradiating the first peeling layer.

9. The method of manufacturing a thin film circuit device according to claim 1, the second peeling layer forming a material which has a function of peeling by irradiating energy, and the peeling the second thin film circuit including irradiating the second peeling layer.

* * * * *